(12) United States Patent
Yeh et al.

(10) Patent No.: US 8,445,307 B2
(45) Date of Patent: May 21, 2013

(54) MONOLITHIC IC AND MEMS MICROFABRICATION PROCESS

(75) Inventors: Richard Yeh, Sunnyvale, CA (US); David M Bloom, Jackson, WY (US)

(73) Assignee: Alces Technology, Inc., Jackson, WY (US)

( * ) Notice: Subject to any disclaimer, the term of this patent is extended or adjusted under 35 U.S.C. 154(b) by 228 days.

(21) Appl. No.: 12/968,594

(22) Filed: Dec. 15, 2010

(65) Prior Publication Data

US 2011/0084343 A1  Apr. 14, 2011

Related U.S. Application Data

(63) Continuation of application No. 11/602,087, filed on Nov. 20, 2006, now Pat. No. 7,875,484.

(51) Int. Cl.
*H01L 21/00* (2006.01)
(52) U.S. Cl.
USPC ............... 438/52; 438/50; 438/53; 438/54; 438/56; 438/704; 438/705; 438/706; 257/415; 257/416; 257/417; 257/418; 257/419
(58) Field of Classification Search
USPC ... 438/50, 52–54, 56, 704–706; 257/415–419
See application file for complete search history.

(56) References Cited

U.S. PATENT DOCUMENTS

| 5,573,679 | A |  | 11/1996 | Mitchell et al. |
|---|---|---|---|---|
| 6,087,701 | A | * | 7/2000 | Bergstrom et al. ............ 257/414 |
| 6,174,820 | B1 |  | 1/2001 | Habermehl et al. |
| 6,521,965 | B1 |  | 2/2003 | Lutz et al. |
| 6,531,331 | B1 |  | 3/2003 | Bennett |
| 6,943,037 | B2 |  | 9/2005 | Anagnostopoulos et al. |
| 7,078,337 | B2 |  | 7/2006 | Campbell et al. |
| 7,112,951 | B2 |  | 9/2006 | Berkcan et al. |
| 7,160,752 | B2 |  | 1/2007 | Ouellet et al. |
| 7,221,144 | B2 |  | 5/2007 | Berkcan et al. |
| 7,315,161 | B2 |  | 1/2008 | Zribi et al. |
| 7,375,874 | B1 |  | 5/2008 | Novotny et al. |
| 2004/0220650 | A1 |  | 11/2004 | Houben et al. |
| 2005/0177045 | A1 |  | 8/2005 | Degertekin et al. |
| 2006/0131501 | A1 |  | 6/2006 | Ikushima et al. |
| 2007/0037311 | A1 |  | 2/2007 | Izumi et al. |
| 2007/0097488 | A1 | * | 5/2007 | Kyoung et al. ............... 359/291 |
| 2008/0122431 | A1 |  | 5/2008 | Berkcan et al. |

OTHER PUBLICATIONS

Larry Hornbeck, "Digital Light Processing and MEMS: An Overview", Texas Instruments website, undated, 3 pages.
Sandia National Laboratories (author unknown), "SUMMiT V Overview", Sandia National Laboratories website, undated, 3 pages.
David Grosjean, et al. "Using advance macrodefect inspection technology in MEMS processes", Micro Magazine website, undated, 8 pages.

(Continued)

*Primary Examiner* — Bac Au
(74) *Attorney, Agent, or Firm* — NUPAT, LLC; Morrison Ulman

(57) ABSTRACT

Monolithic IC/MEMS processes are disclosed in which high-stress silicon nitride is used as a mechanical material while amorphous silicon serves as a sacrificial layer. Electronic circuits and micro-electromechanical devices are built on separate areas of a single wafer. The sequence of IC and MEMS process steps is designed to prevent alteration of partially completed circuits and devices by subsequent high process temperatures.

6 Claims, 24 Drawing Sheets

OTHER PUBLICATIONS

Written Opinion of the International Searching Authority and International Search Report for PCT/US2007/085022 (Apr. 21, 2008).
(D3) T. J. Brosnihan et al., "Optical IMEMS—A Fabrication Process for MEMS Optical Switches with Integrated On-Chip Electronics," Transducers, Solid State Sensors, Actuators and Microsystems, 12th Intl. Conf. On, v. 2, p. 1638-1642, IEEE 2003.
(D4) X. Jin et al., "The Microfabrication of Capacitive Ultrasonic Transducers," J. Microelectromechanical Systems, v. 7, p. 295-301, IEEE 1998.
(D5) D. M. Bloom, "The Grating Light Valve: revolutionizing display technology," Proc. SPIE, v. 3013, p. 165-171, SPIE 1997.
(ESSR) Extended European Search Report in EPO application 07864561.1-2203 / 2084747 PCT/US2007085022, European Patent Office, May 3, 2012.

* cited by examiner

MONOLITHIC IC AND MEMS MICROFABRICATION PROCESS

RELATED APPLICATIONS

This application is a continuation of U.S. patent application Ser. No. 11/602,087, filed on Nov. 20, 2006 and incorporated herein by reference.

TECHNICAL FIELD

The disclosure relates generally to microfabrication processes. In particular it relates to integrated circuit and MEMS wafer processing techniques.

BACKGROUND

Integrated circuits created on semiconductor wafers are ubiquitous in modern electronic devices. These circuits may be implemented in a wide variety of semiconductor technologies including, for example, metal-oxide-semiconductor (MOS), complementary MOS (CMOS), bipolar CMOS (BiCMOS) or bipolar junction transistors (BJT). Further, although silicon is by far the most widely used semiconductor substrate, electronic circuits are also made with other semiconductors such as silicon—germanium (SiGe) and gallium arsenide (GaAs).

Over the past twenty years new techniques for making mechanical devices on silicon, semiconductor, and insulating wafer substrates have also been developed. These devices are often termed "micro-electromechanical systems" or MEMS. Examples of MEMS include accelerometers used to trigger automobile air bag deployment and light modulator chips in some types of visual displays.

Integrated circuits (IC's) may be used to create, send, receive, and interpret instructions or data, to and from MEMS devices. IC and MEMS chips can be interconnected with one another by circuit boards or by more advanced techniques such as flip-chip bonding. However, the most efficient, compact and highest performance connection between IC's and MEMS occurs when the two technologies are created or integrated monolithically; i.e. on the same wafer.

Several combined IC and MEMS silicon fabrication processes exist. For example, processes developed by Texas Instruments, Analog Devices and Sandia National Laboratory represent a few approaches to IC/MEMS integration.

These and other IC/MEMS processes vary in the order of their process steps, the structural material used for MEMS components, and the sacrificial material removed to release MEMS structures, among other aspects. One consideration that affects the order of processing steps is the ability of a partially completed IC/MEMS device to withstand high temperatures. Both mechanical and electronic devices on a partially completed wafer may be adversely affected by high process temperatures in later processing steps.

Texas Instruments' Digital Light Processor MEMS process uses metal as a structural material and organic polymer as a sacrificial material. A thick oxide is deposited over Metal-2 of a CMOS process and then planarized using a chemical mechanical polish (CMP) technique. The CMP step provides a flat substrate for Digital Mirror Device superstructure fabrication. This is an example of a stacked process; in other words, one in which electronic and mechanical components are stacked vertically on a wafer.

Analog Devices' integrated MEMS (iMEMS) process begins with CMOS processing through the creation of polysilicon gates. An area is left empty in the center of each die for a MEMS sensor. Sensors are created in successive steps: a sacrificial oxide and a polysilicon structural layer are deposited, and then sensor elements are patterned. Next, aluminum interconnects are formed and the circuit is passivated. Finally the sensor elements are released while the circuit remains protected.

Sandia National Laboratory's Ultra-planar, Multi-level MEMS Technology 5 (SUMMiT V™) Fabrication Process is a five-layer polycrystalline silicon surface micromachining process comprising one ground plane or electrical interconnect layer and four mechanical layers. The SUMMiT process uses polysilicon as a structural material and silicon dioxide as a sacrificial material. MEMS process steps are performed first, followed by chemical mechanical planarization and CMOS.

Each class of structural or sacrificial materials used in the MEMS part of a monolithic IC/MEMS process presents a challenge to the process design engineer. Therefore the art of monolithic IC/MEMS processing is fertile ground for innovation.

BRIEF DESCRIPTION OF THE DRAWINGS

The drawings are heuristic for clarity.

DETAILED DESCRIPTION

Figure 1:
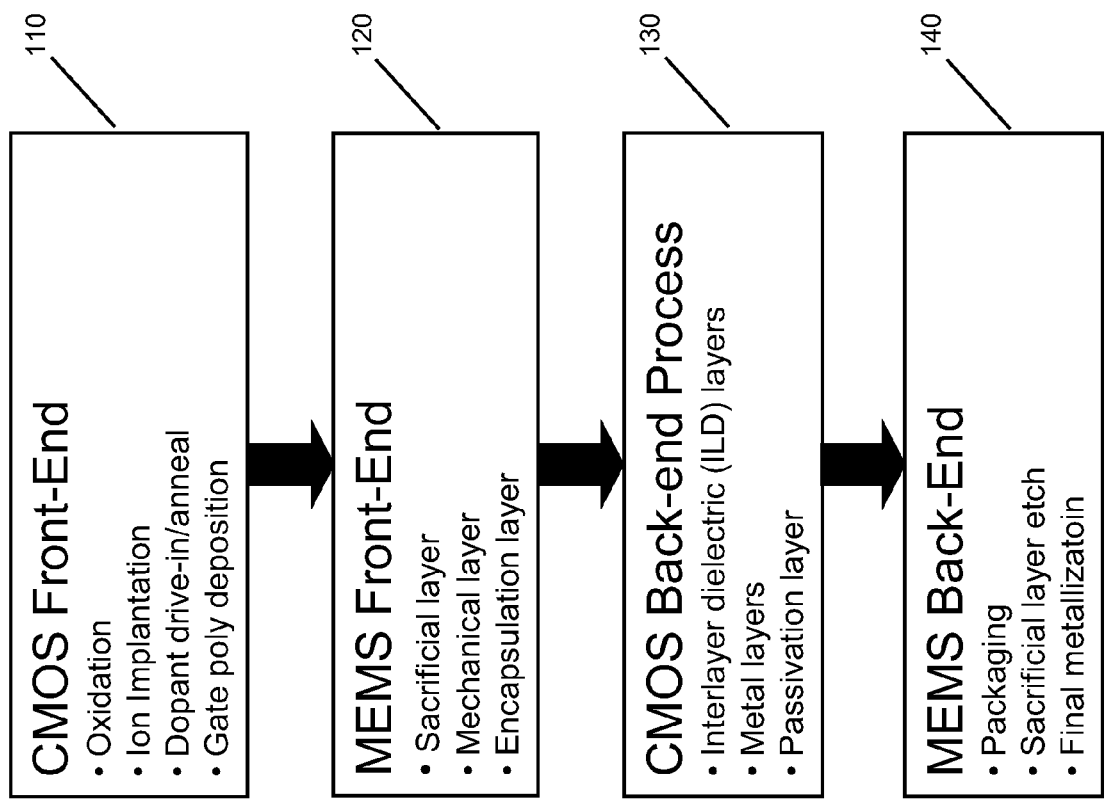
FIG. 1 shows a flow chart for a monolithic IC/MEMS microfabrication process.

MEMS light modulators are optomechanical components that control the amplitude and/or phase of light beams and form the optical engine of digital display systems. Examples of MEMS light modulators include: the Texas Instruments Digital Mirror Device; the grating light modulator described in U.S. Pat. No. 5,311,360 (and many subsequent variations); and the polarization light modulators described in U.S. Pat. No. 7,054,051 and in U.S. patent application Ser. No. 11/161,452 filed on Aug. 3, 2005 and Ser. No. 11/336,277 filed on Jan. 20, 2006, both of which are incorporated herein by reference.

Micro-electromechanical structures in MEMS light modulators are driven by electrical signals representing image data which is created, buffered, and otherwise manipulated by digital integrated circuits. Integration of electronic circuits and MEMS structures on a single silicon wafer helps make digital display systems more compact, cheaper, and more reliable by eliminating problems related to the interconnection of IC and MEMS chips.

Many IC and MEMS microfabrication processes share some common features. For example, mechanical devices or electronic circuits are built on (or within) a silicon substrate by the deposition or growth of layers of materials. The layers are patterned, etched, implanted and/or polished to create mechanically or electronically distinct regions on a chip. MEMS processes often include a sacrificial layer of material that is removed in the later stages of microfabrication to release movable mechanical structures. The monolithic IC/MEMS processes described herein use a "side-by-side" approach in which IC and MEMS components are created in separate areas of a wafer rather than stacked vertically.

The various steps in MEMS and CMOS processes that create or modify material layers are performed over a wide range of process temperatures. For example a silicon oxidation step may involve temperatures as high as about 1100° C. while evaporative aluminum metallization and packaging steps can be performed without raising the temperature of a wafer above about 250° C. Exposing a partly processed wafer to high temperatures may ruin, affect or change existing processed layers. For example, high temperature can affect stress in mechanical layers or cause diffusion of dopant ions implanted in electronic layers.

The integrated IC/MEMS processes described here are designed for MEMS devices in which high-stress $Si_3N_4$ is a structural material while amorphous silicon ($\alpha$-Si) is used as a sacrificial layer. However, the processes are equally applicable to other materials systems with similar thermal requirements. High-stress silicon nitride is the structural material in many ribbon-based MEMS light modulator designs. Further the "side-by-side" approach is independent of materials used.

Three IC/MEMS process variants are described. An exemplary CMOS process is used for description; however, the IC/MEMS processes described are equally amenable to other CMOS, MOS, BJT BiCMOS, etc. processes. CMOS processes may vary according to: the number of metal layers, planarization methods, type of field oxide, single vs. twin well designs, etc. None of these variations in IC processes affects the monolithic IC/MEMS methods described herein.

In the first monolithic IC/MEMS process IC and MEMS sections are each divided into front-end and back-end sections. The overall process involves performing IC front-end steps, followed by MEMS front-end steps, followed by IC back-end steps, finally followed by MEMS back-end steps. Each section of the process uses process temperatures that are lower than those in the preceding section.

In the second monolithic IC/MEMS process MEMS front-end steps are followed by a complete IC process and then by MEMS back-end steps. The third monolithic IC/MEMS process is a variant of the second process in which local oxidation of silicon (LOCOS) is used as a planarization technique in the MEMS front-end before complete IC and MEMS back-end steps.

Figure 2:
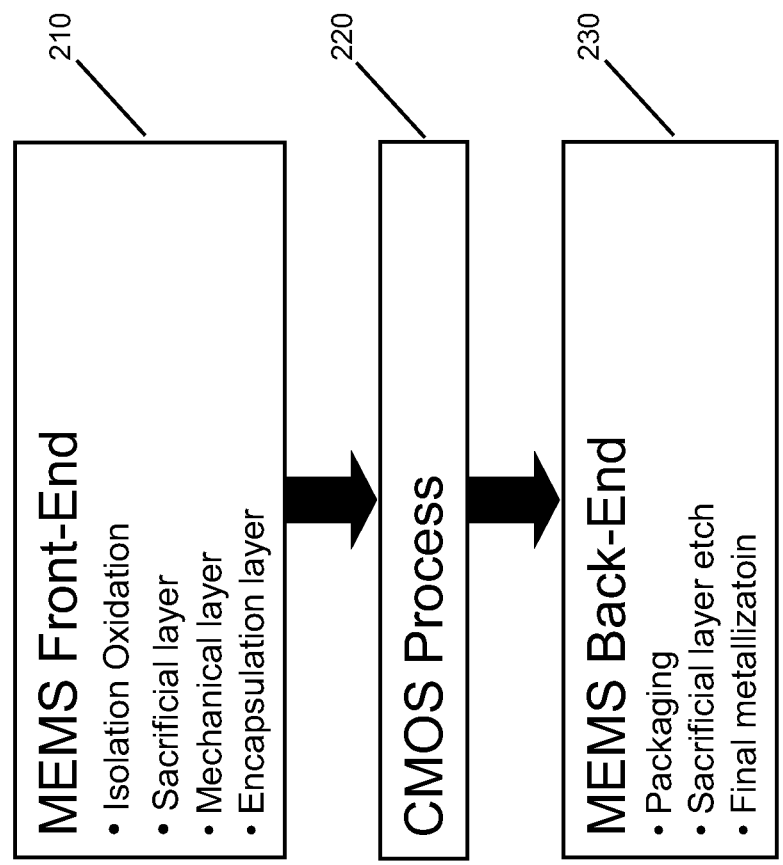
FIG. 2 shows a flow chart for a monolithic IC/MEMS microfabrication process.
Figure 3:
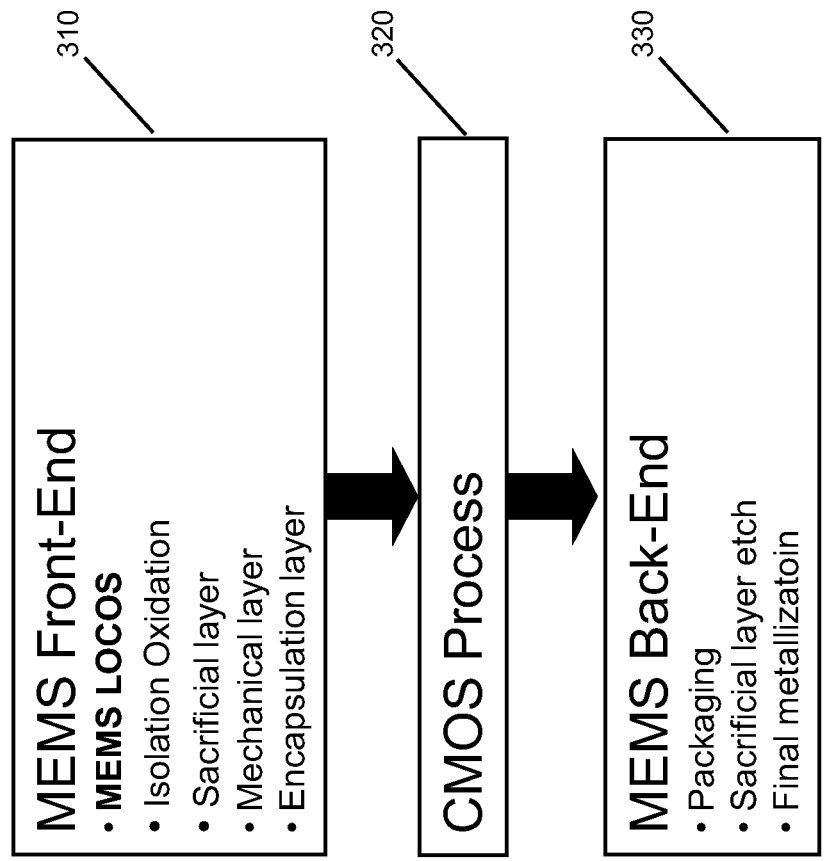
FIG. 3 shows a flow chart for a monolithic IC/MEMS microfabrication process.

FIGS. 1, 2 and 3 show flow charts for monolithic IC/MEMS microfabrication processes that are described in more detail below. In FIG. 1 blocks 110, 120, 130 and 140 represent the sections of a monolithic IC/MEMS process. Block 110 is a CMOS front-end section which may involve process temperatures in excess of about 800-1000° C. Block 120 is the MEMS front-end section which involves process temperatures below about 800° C. Block 130 is a CMOS back-end section which involves process temperatures below about 450° C. Finally, block 140 is the MEMS back-end section which involves process temperatures below about 250° C.

Process steps in the CMOS front-end include oxidation, ion implantation, dopant drive-in and annealing, and gate polysilicon deposition. Process steps in the MEMS front-end include deposition of a sacrificial layer (e.g. amorphous silicon), a mechanical layer (e.g. silicon nitride) and an encapsulation layer. Process steps in the CMOS back-end include deposition of interlayer dielectrics, metal layers and passivation. Finally, process steps in the MEMS back-end include removal of sacrificial layers, final metallization and packaging.

In FIG. 2 blocks 210, 220 and 230 represent the sections of a monolithic IC/MEMS process. Block 210 is the MEMS front-end section which generally involves process temperatures below about 1000° C. Block 220 represents an IC process. Block 230 is the MEMS back-end section which involves process temperatures below about 250° C.

Process steps in the MEMS front-end include isolation oxidation, deposition of a sacrificial layer (e.g. amorphous silicon), a mechanical layer (e.g. silicon nitride) and an encapsulation layer. Process steps in the CMOS process include, for example: oxidation, ion implantation, dopant drive-in and annealing, gate polysilicon deposition, interlayer dielectrics, metal layers and passivation. Process steps in the MEMS back-end include removal of sacrificial layers, final metallization and packaging.

In FIG. 3 blocks 310, 320 and 330 represent the sections of a monolithic IC/MEMS process. Block 310 is the MEMS front-end section which generally involves process temperatures below about 1000° C. Block 320 represents a CMOS process. Block 330 is the MEMS back-end section which involves process temperatures below about 250° C. The process presented in FIG. 3 is similar to that shown in FIG. 2 with the addition of MEMS LOCOS (local oxidation of silicon) steps in the MEMS front-end section.

Figure 19:
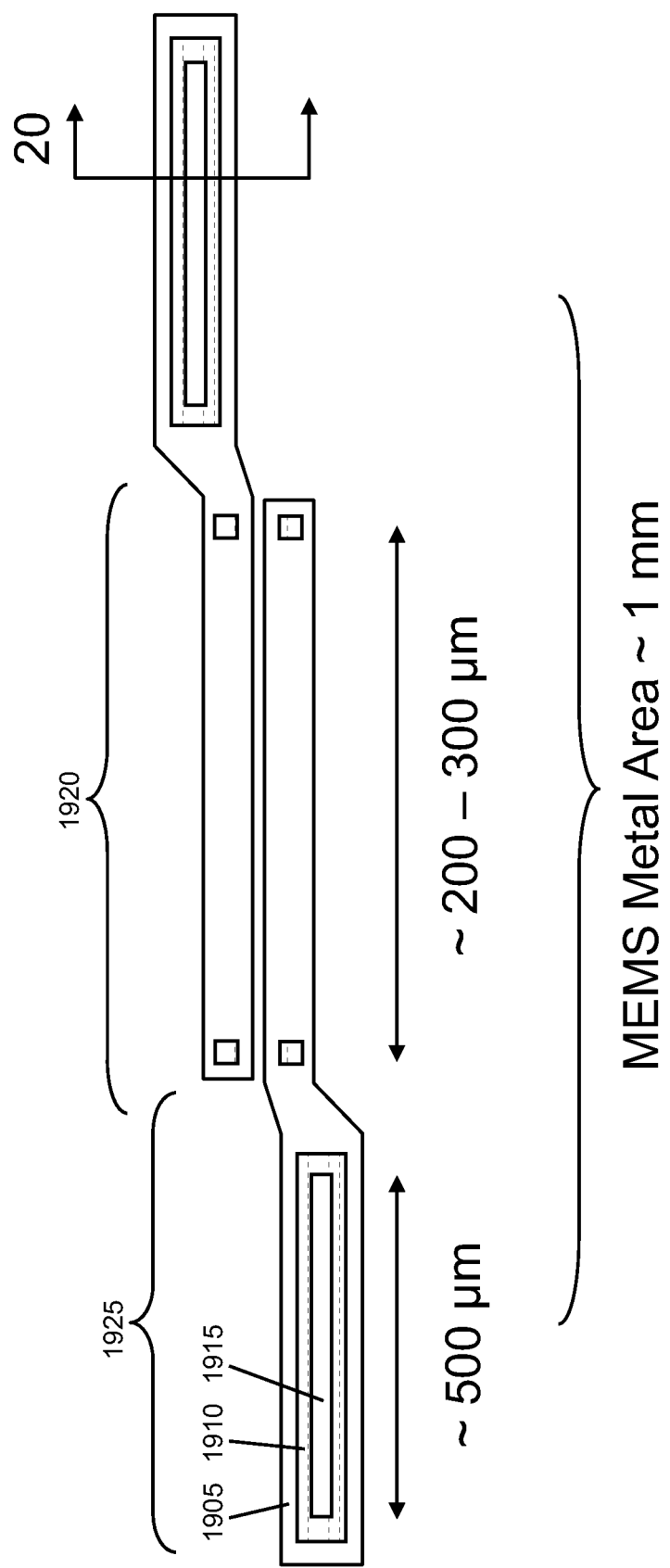
FIG. 19 shows a schematic plan view of part of a monolithic IC/MEMS microfabricated device.
Figure 20:
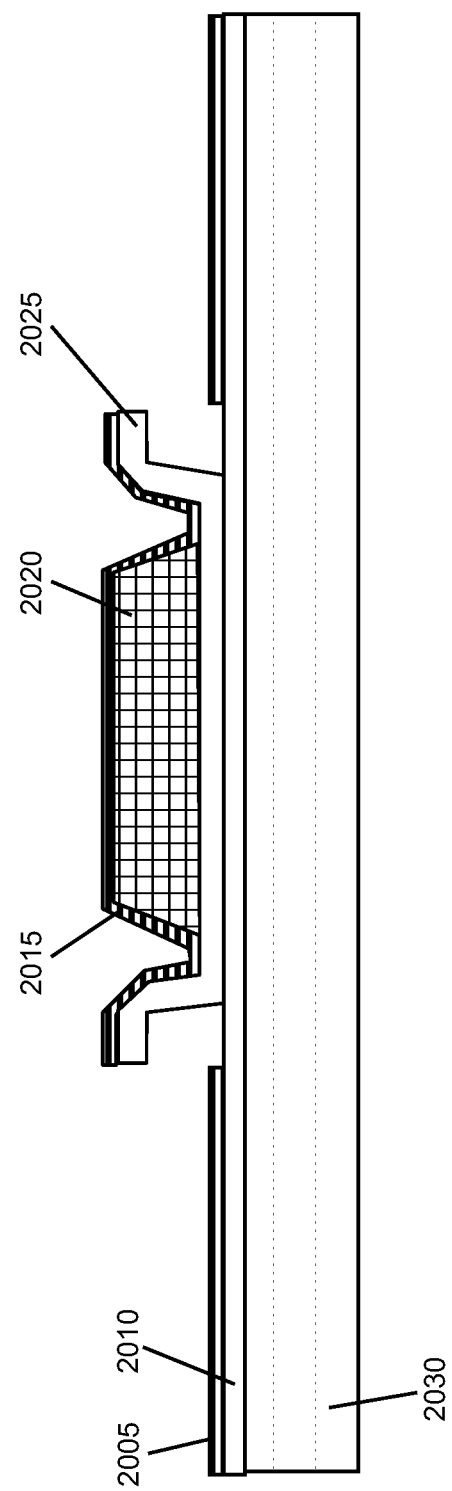
FIG. 20 shows a cross section of part of the device illustrated in FIG. 19.
Figure 21:
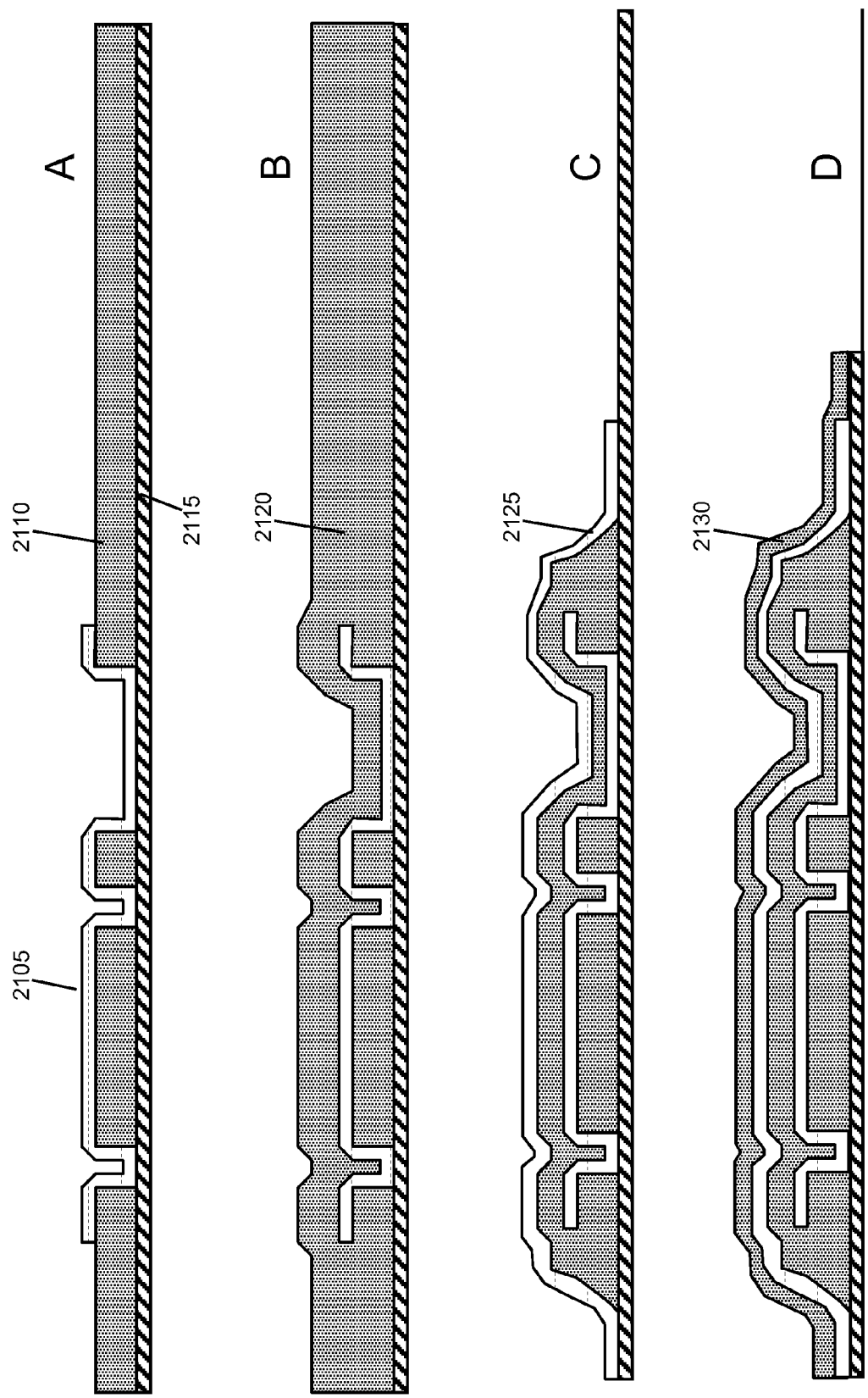
FIGS. 21 A-D show material layers in a partially completed monolithic IC/MEMS microfabricated device.
Figure 22:
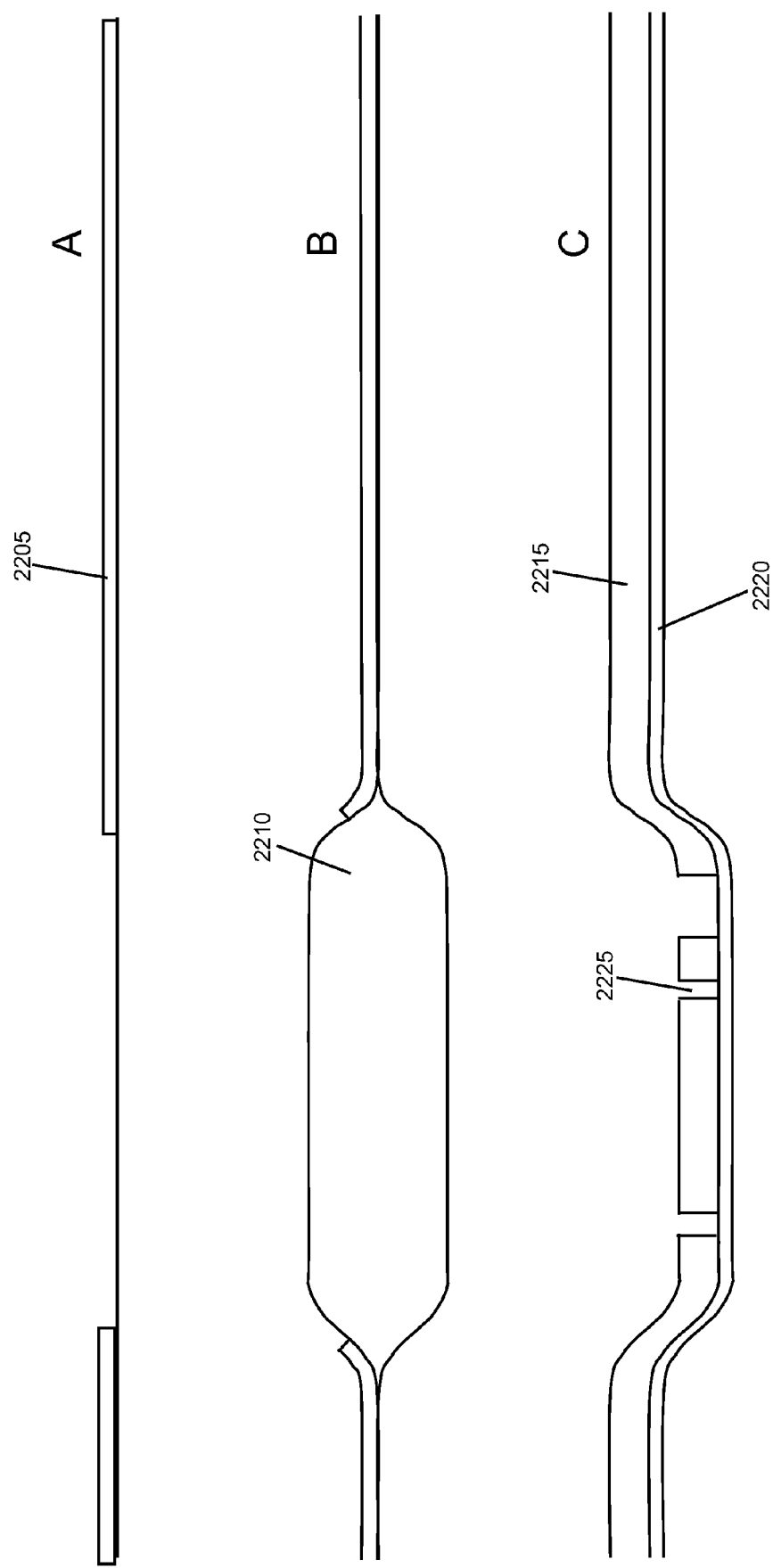
FIGS. 22 A-C show material layers in a partially completed monolithic IC/MEMS microfabricated device.
Figure 23:
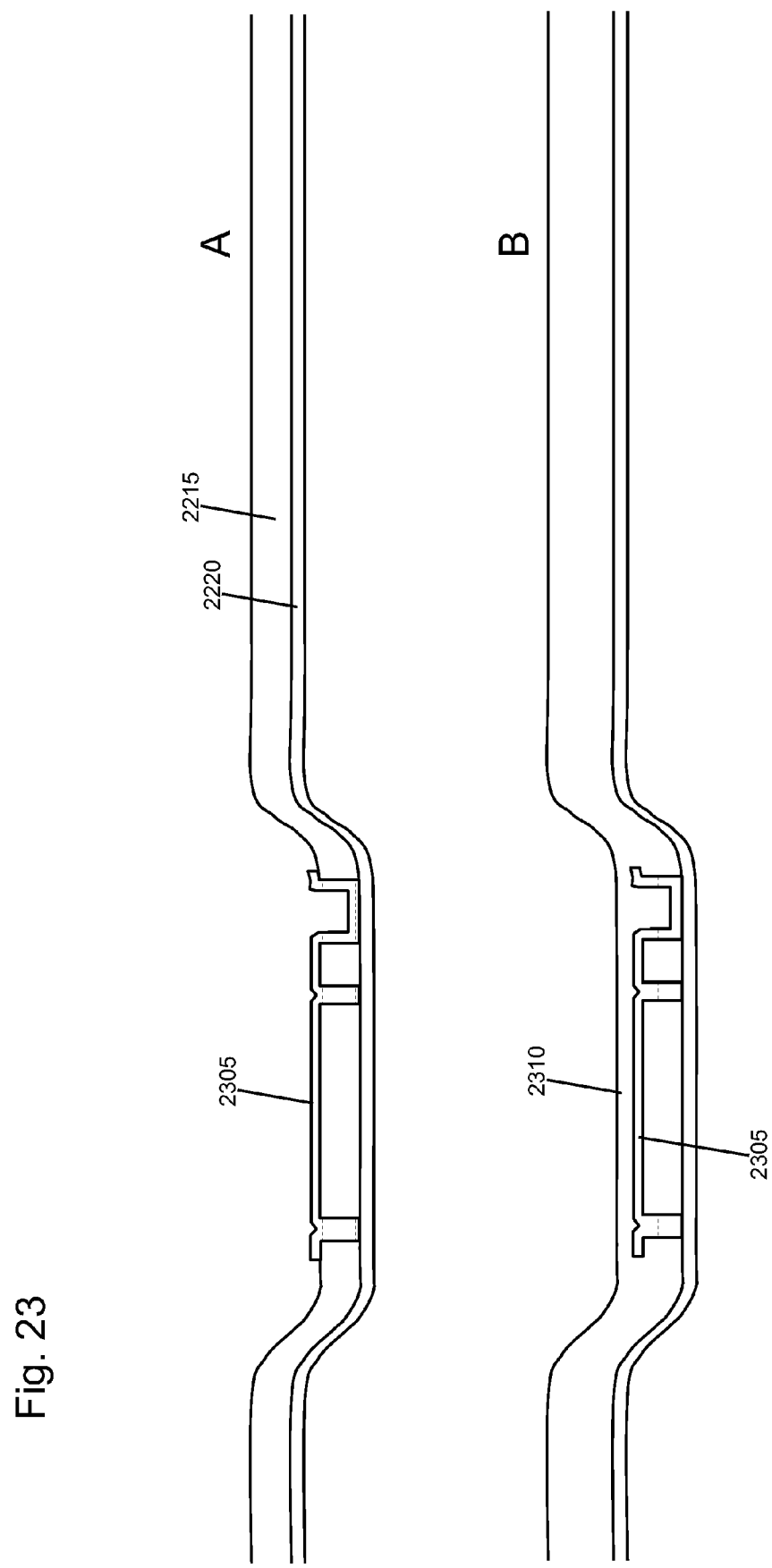
FIGS. 23 A-B show material layers in a partially completed monolithic IC/MEMS microfabricated device.
Figure 24:
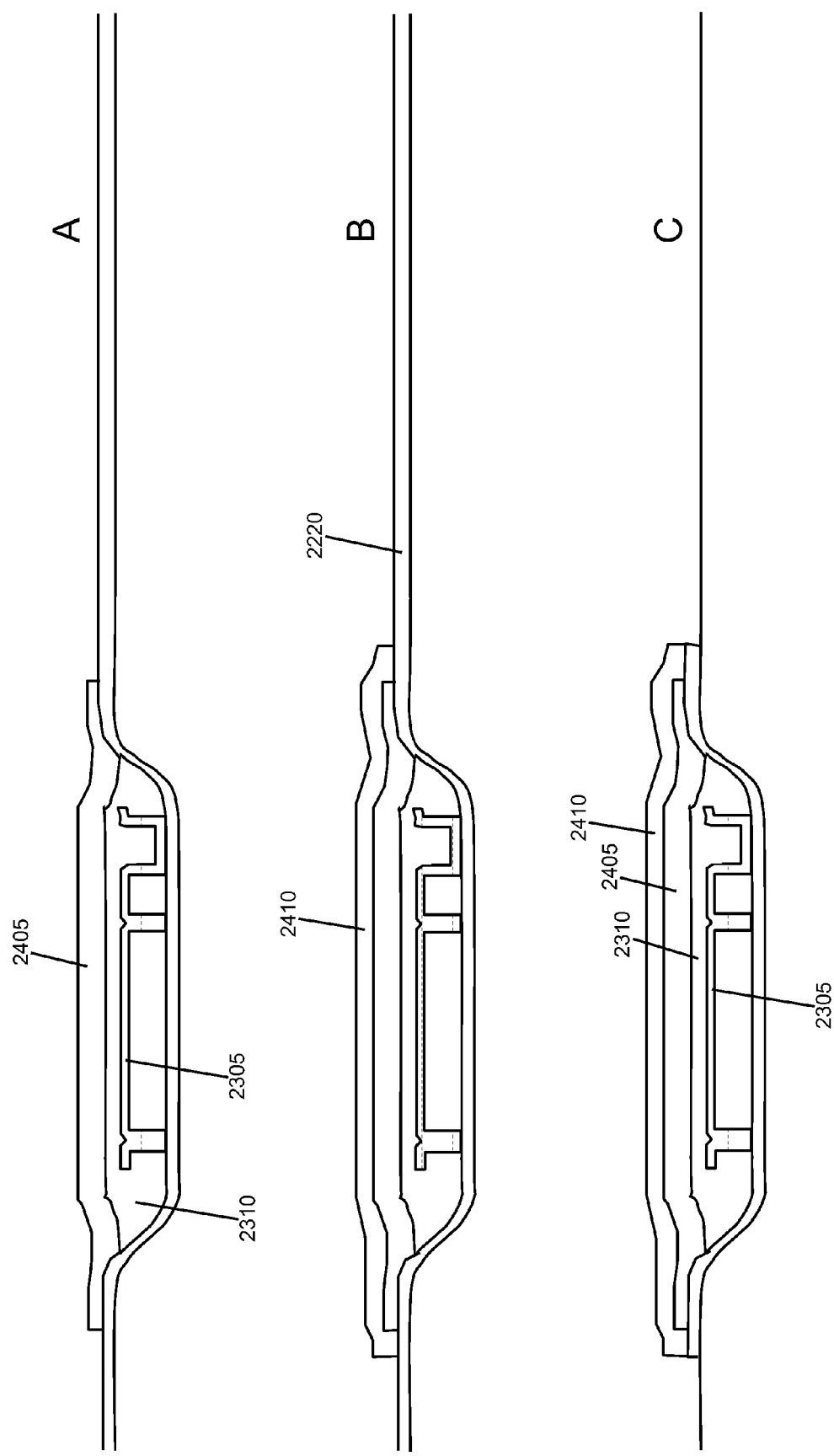
FIGS. 24 A-C show material layers in a partially completed monolithic IC/MEMS microfabricated device.

The three processes outlined in block sections in FIGS. 1, 2 and 3 are now described in more detail in terms of layer-by-layer manufacturing steps. FIGS. 4-18 are cross sectional schematics of material layers in a monolithic IC/MEMS microfabricated device and follow the outline of FIG. 1. FIGS. 19-20 further illustrate parts of the process of FIG. 1. FIG. 21 illustrates steps outlined in FIG. 2 while FIGS. 22-24 illustrate steps outlined in FIG. 3. In each figure, regions that are shaded or hatched the same represent the same material unless otherwise noted. Further, cross-sections shown in the figures do not show every feature or structure in a final device, but only those that are needed to understand how to execute a monolithic IC/MEMS fabrication process. In particular, since the processes described herein use a side-by-side approach (in which IC and MEMS devices are built in different areas of a wafer) the description that follows focuses primarily on processing in the MEMS area of a wafer.

Figure 4:
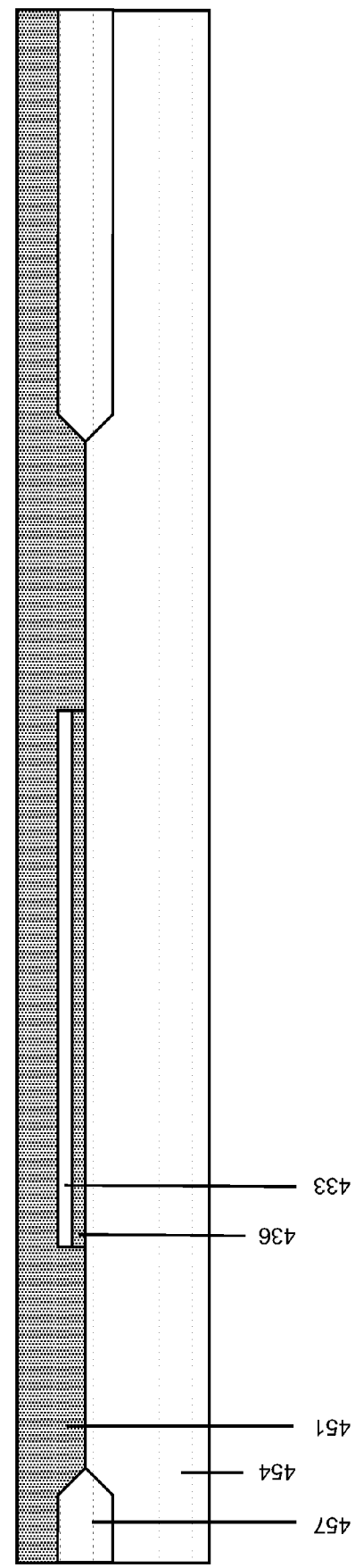
FIG. 4 shows material layers in a partially completed monolithic IC/MEMS microfabricated device.

Turning now to FIG. 4, silicon substrate 454 is shown with field oxide 457, gate oxide 436, gate polysilicon 433 and interlayer dielectric 451. At this stage the interlayer dielectric is planarized and patterned for contacts. This represents the end of a CMOS front-end section corresponding, for example, to section 110 in FIG. 1. Other CMOS front-end sections (e.g. those not including planarization) or MOS, BJT, etc. front-end sections could also have been used.

Figure 5:
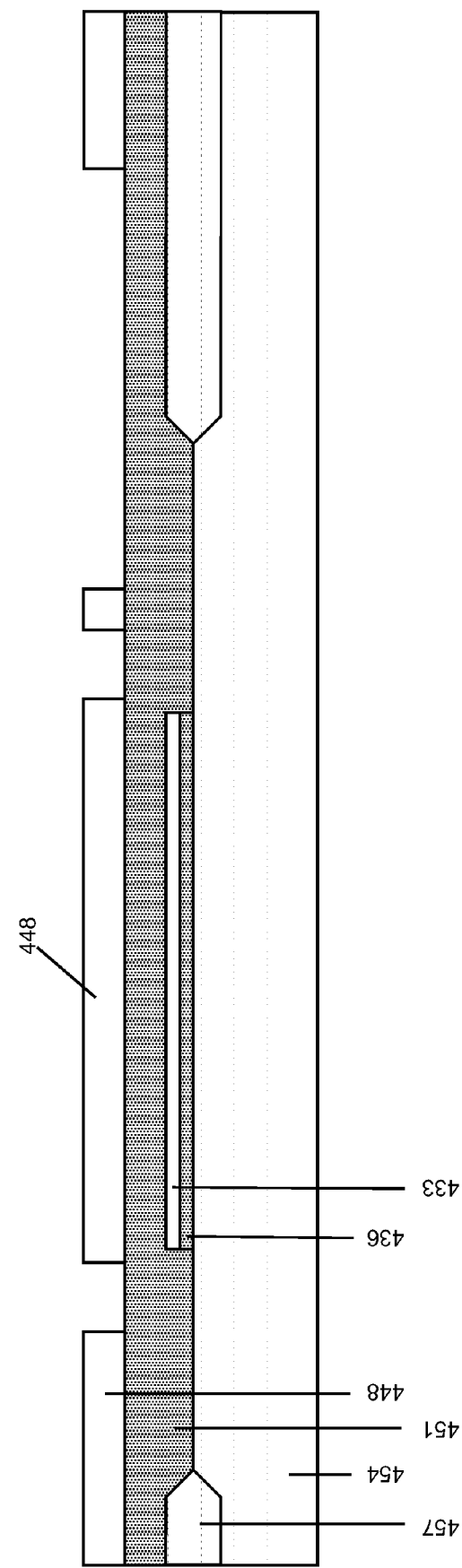
FIG. 5 shows material layers in a partially completed monolithic IC/MEMS microfabricated device.

FIG. 5 represents the beginning of MEMS front-end block 120 of FIG. 1. FIG. 5 shows all the structures of FIG. 4 with the addition of patterned sacrificial α-Si layer 448. (Roughly speaking silicon deposited below about 600° C. forms α-Si while silicon deposited above about 600° C. forms polysilicon.) In a typical fabrication process for polarization light modulators operating at visible wavelengths, sacrificial silicon layer 448 is about 700 nm thick. This layer thickness may vary depending on the MEMS device being fabricated. Layer 448 is patterned with photolithographic and etch techniques.

Figure 6:
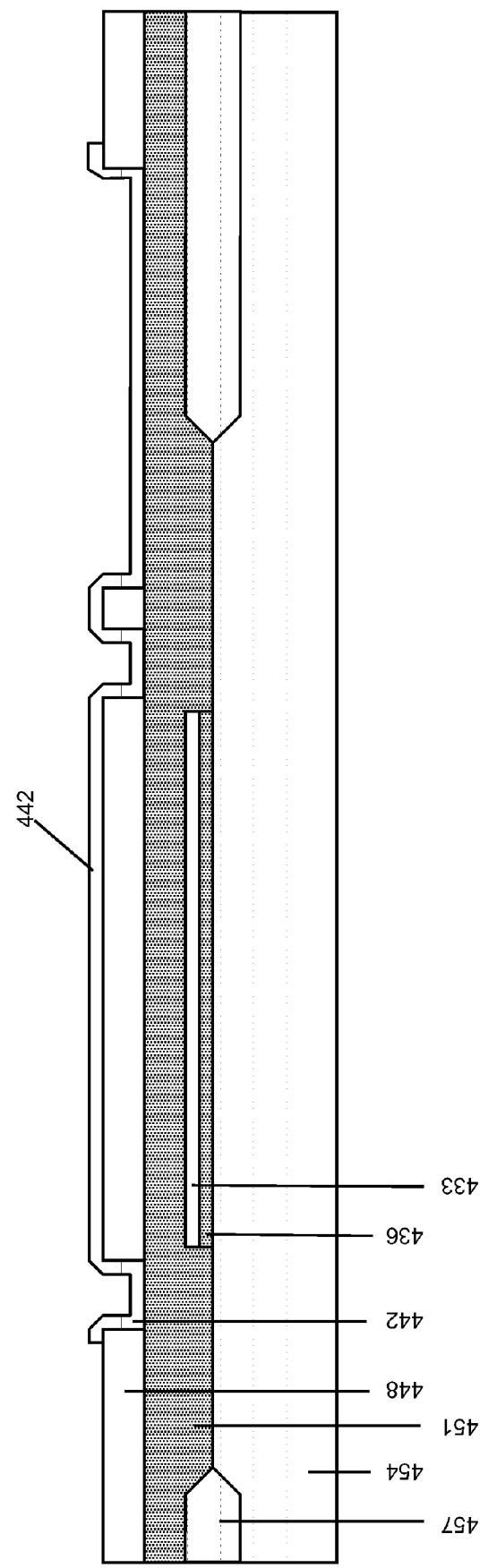
FIG. 6 shows material layers in a partially completed monolithic IC/MEMS microfabricated device.

FIG. 6 shows the result of deposition and patterning stoichiometric silicon nitride layer 442. In a typical fabrication process for polarization light modulators, silicon nitride layer 442 is about 100 nm thick. Layer 442 is patterned with photolithographic and etch techniques.

Figure 7:
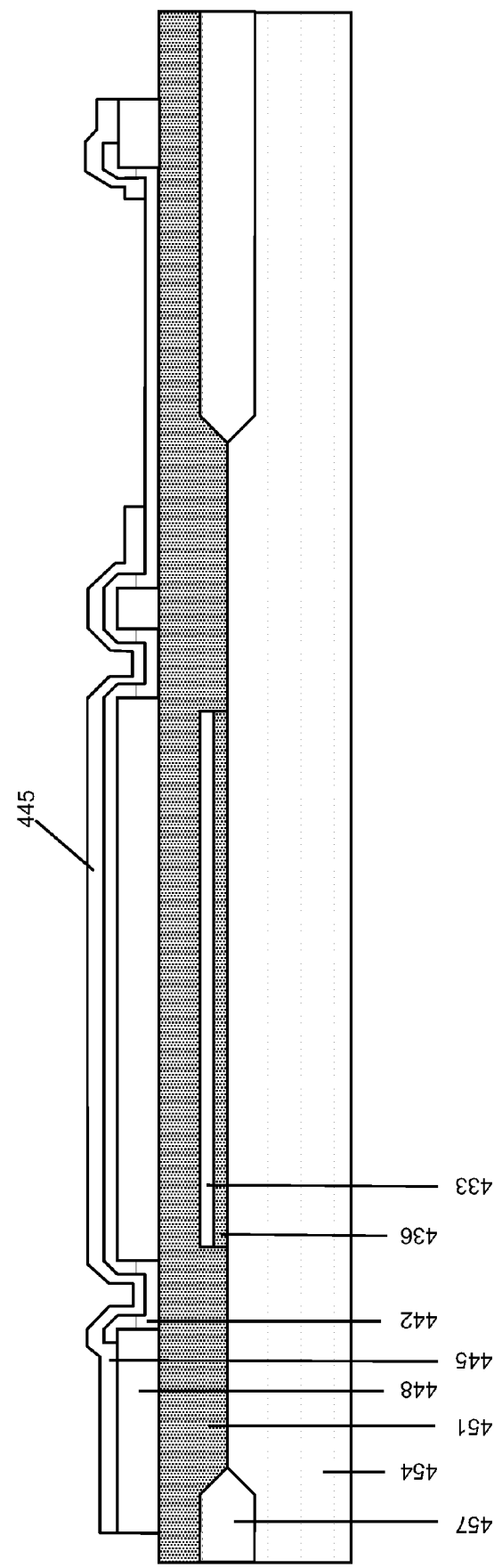
FIG. 7 shows material layers in a partially completed monolithic IC/MEMS microfabricated device.

FIG. 7 shows the result of deposition and patterning α-Si encapsulation layer 445. In a typical fabrication process for polarization light modulators, α-Si encapsulation layer 445 is about 200 nm thick. Layer 445 is patterned with photolithographic and etch techniques. This completes the MEMS front-end block 120 of FIG. 1.

Figure 8:
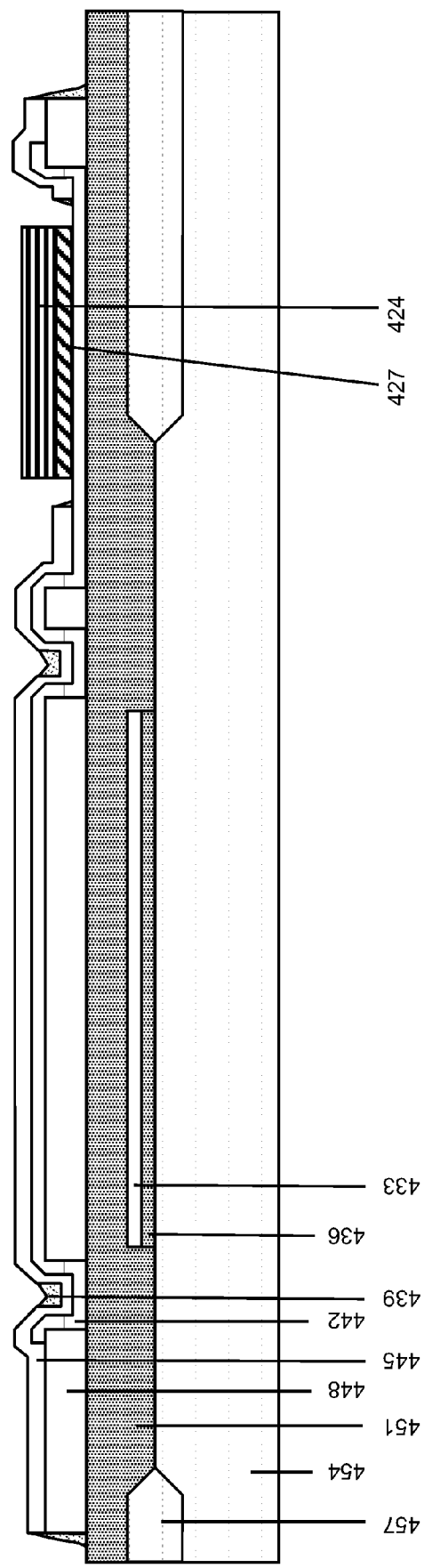
FIG. 8 shows material layers in a partially completed monolithic IC/MEMS microfabricated device.

FIG. 8 represents the beginning of CMOS back-end block 130 of FIG. 1. FIG. 8 shows the result of tungsten deposition and etch-back, and CMOS metal-1 deposition and patterning. In the figure, Ti/TiN layer 427 promotes adhesion of $AlCu_{0.5}$ layer 424. (Here $AlCu_{0.5}$ means aluminum alloyed with 0.5% copper.) At this stage in the process some undesirable tungsten 439 may remain in via holes or steps if it is not etched away by the tungsten wet etch chemistry.

Figure 9:
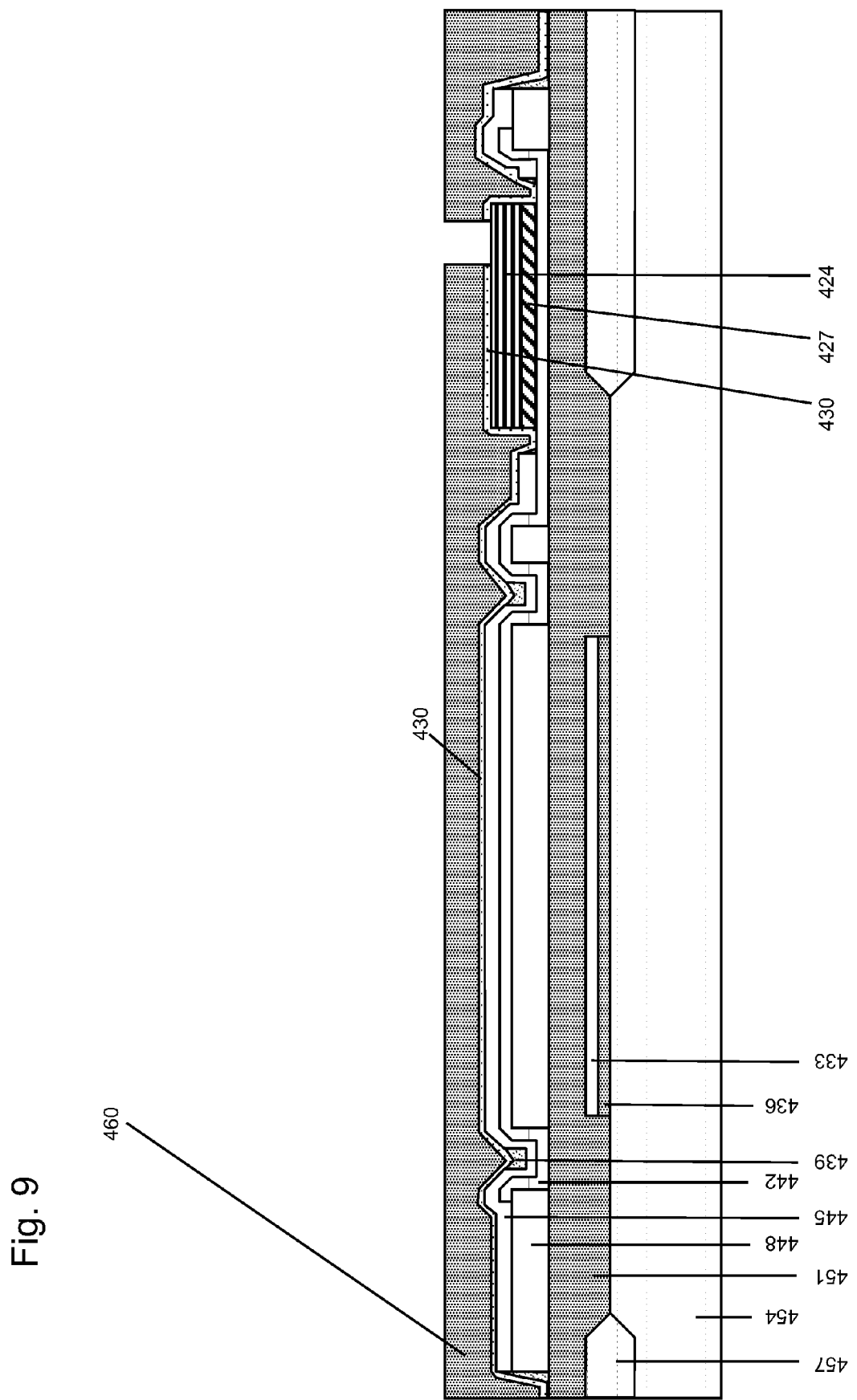
FIG. 9 shows material layers in a partially completed monolithic IC/MEMS microfabricated device.

FIG. 9 shows the result of interlayer dielectric deposition, planarization and patterning for via-1 holes. In FIG. 9 antireflection coating 430 is covered by interlayer dielectric 460. These two layers are patterned with photolithographic and etch techniques.

Figure 10:
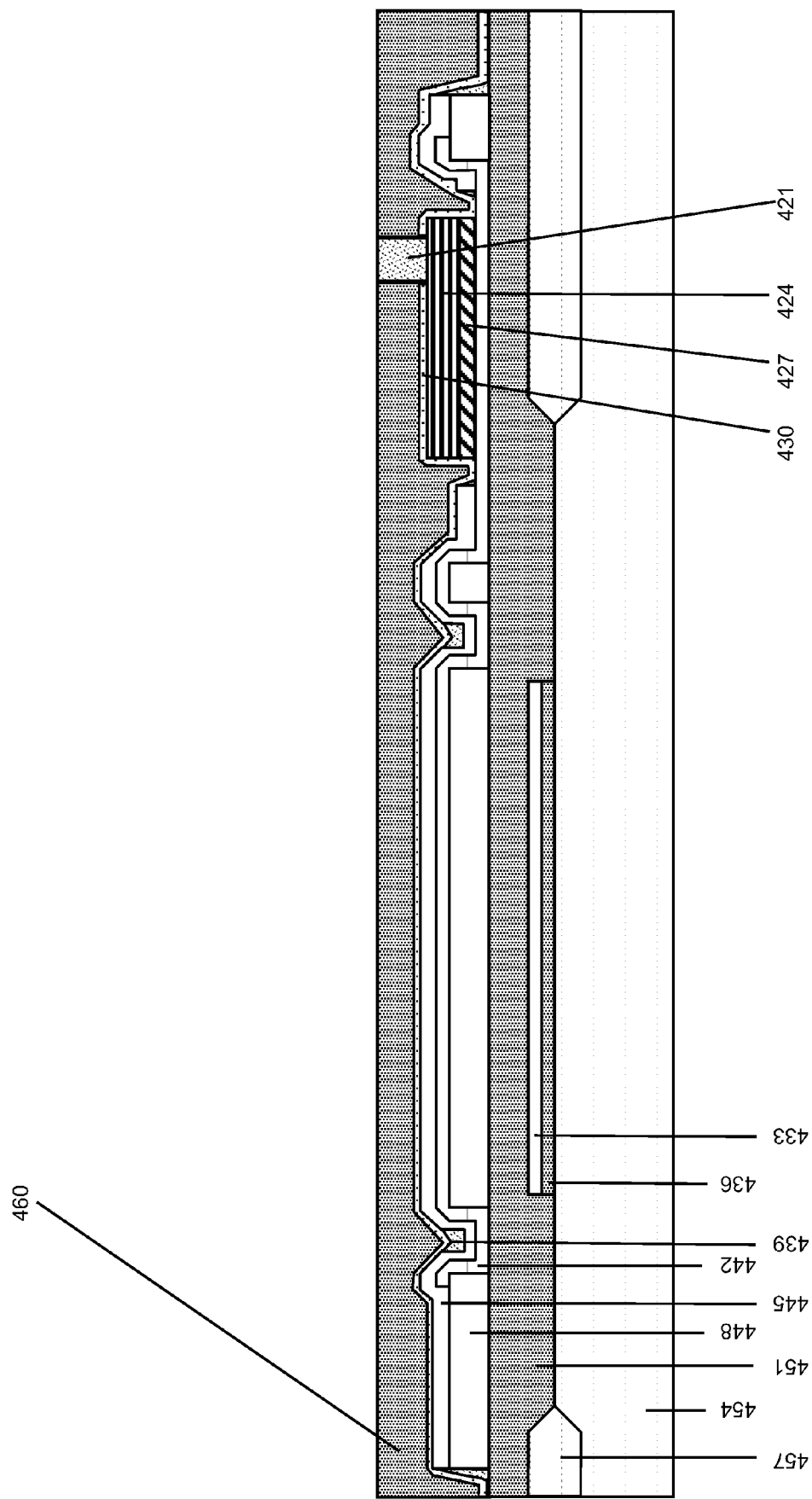
FIG. 10 shows material layers in a partially completed monolithic IC/MEMS microfabricated device.
Figure 11:
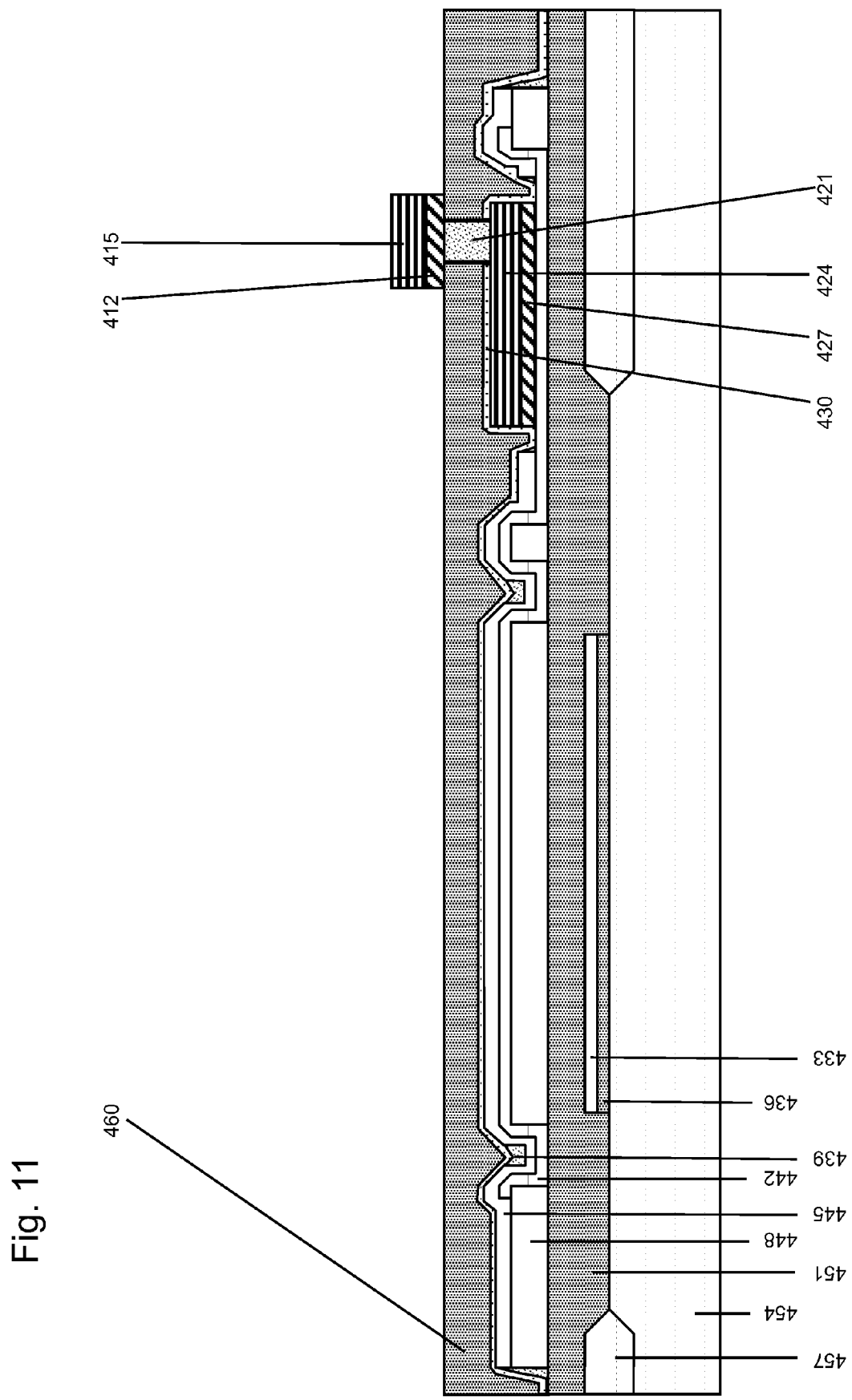
FIG. 11 shows material layers in a partially completed monolithic IC/MEMS microfabricated device.

FIG. 10 shows the result of tungsten deposition and etch-back to form tungsten plug 421. FIG. 11 shows the result of CMOS metal-2 deposition and patterning. In the figure Ti/TiN layer 412 promotes adhesion of $AlCu_{0.5}$ layer 415.

Figure 12:
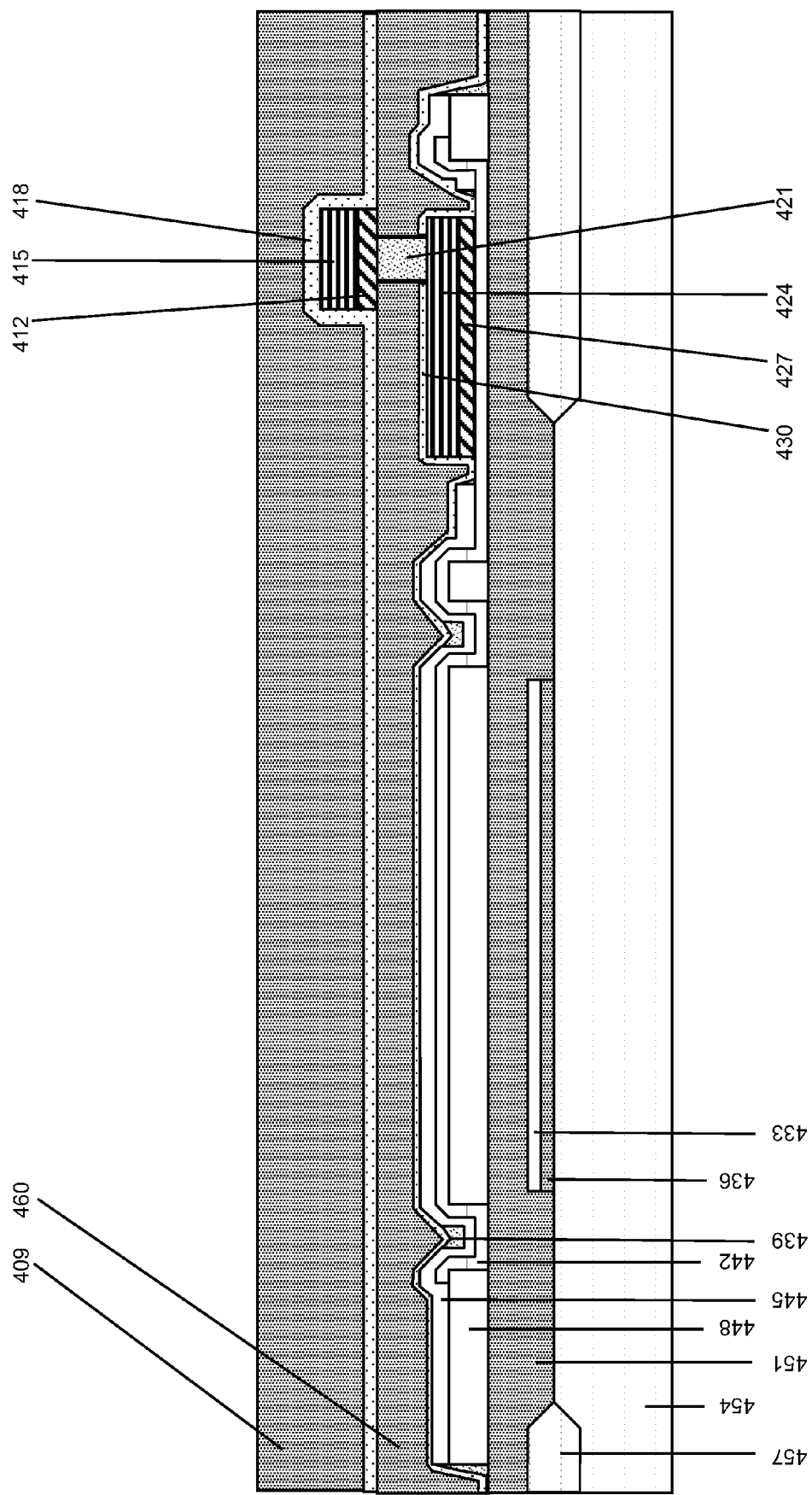
FIG. 12 shows material layers in a partially completed monolithic IC/MEMS microfabricated device.

FIG. 12 shows the result of interlayer dielectric deposition, planarization and patterning for via-2 holes. (For simplicity, no via-2 holes are shown.) In the figure antireflection coating 418 is covered by interlayer dielectric 409.

Figure 13:
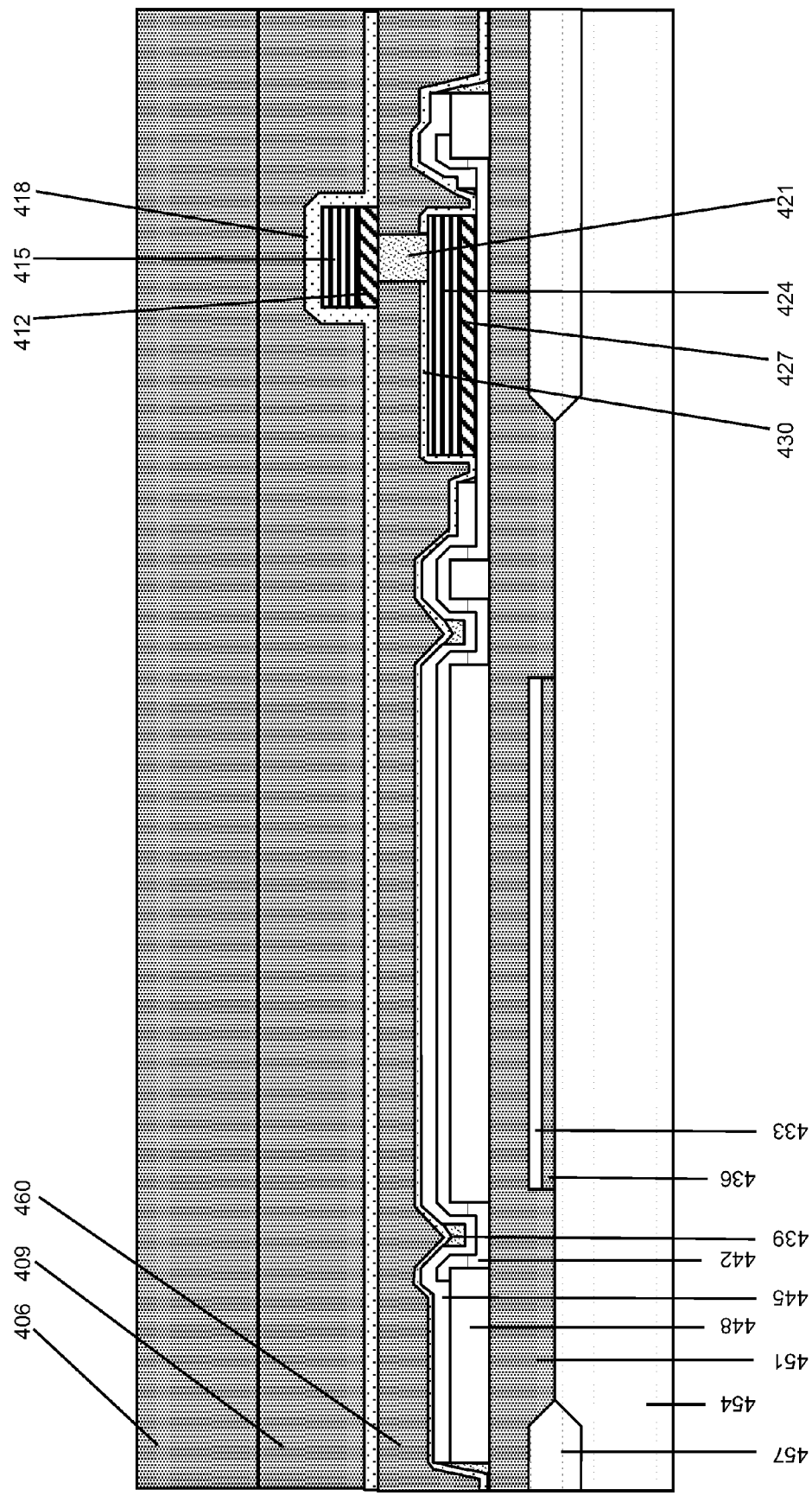
FIG. 13 shows material layers in a partially completed monolithic IC/MEMS microfabricated device.

FIG. 13 shows the result of depositing passivation layer 406 on the structure of FIG. 12. Tungsten plug deposition and etch-back, CMOS metal-3 deposition and patterning, additional interlayer dielectric layers and patterning are all omitted from the figure as there are no CMOS metal-3 features and no bond pads in the MEMS region of a final device. This completes the CMOS back-end block 130 of FIG. 1.

Figure 14:
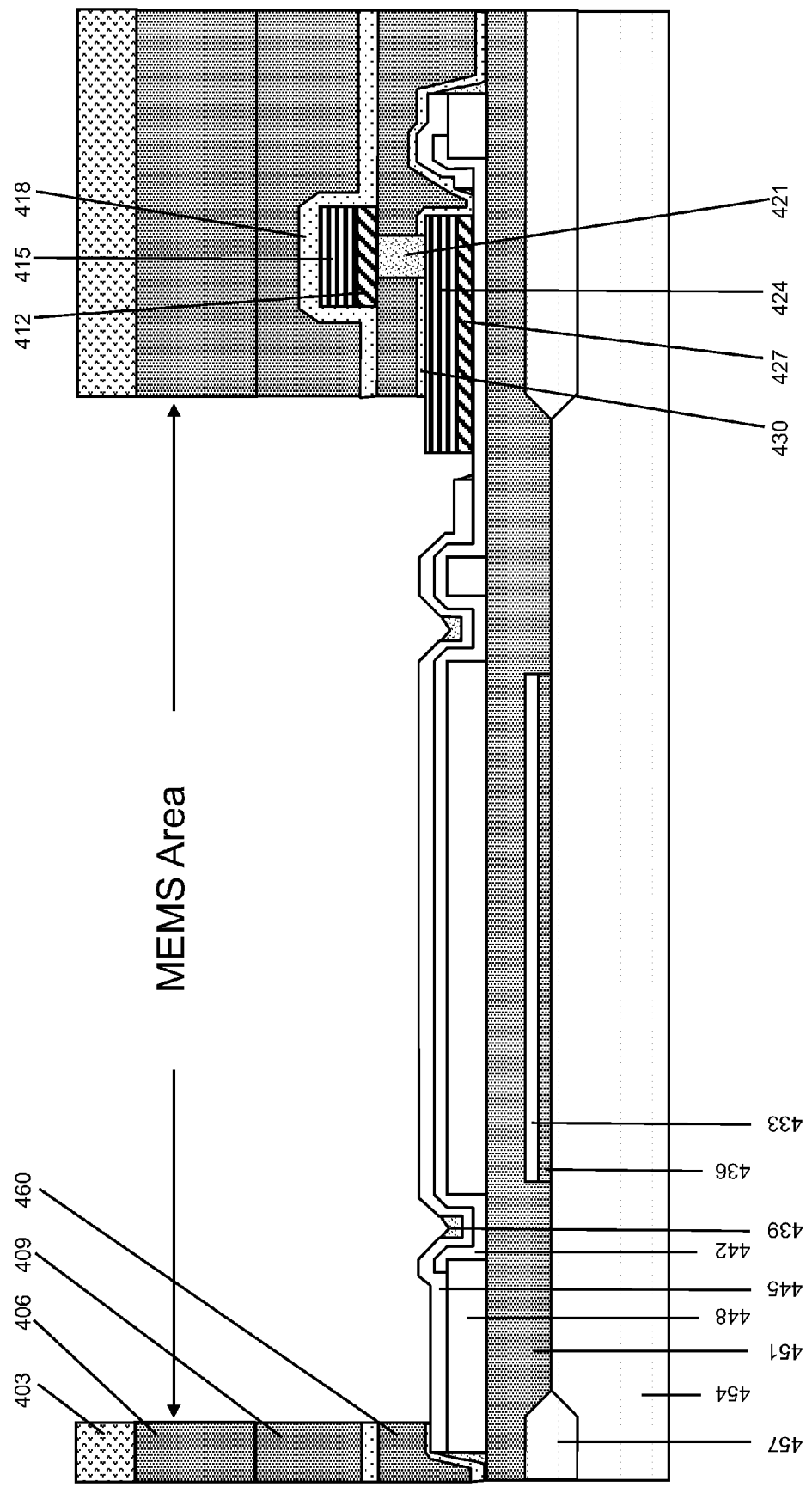
FIG. 14 shows material layers in a partially completed monolithic IC/MEMS microfabricated device.

FIG. 14 represents the beginning of MEMS back-end block 140 of FIG. 1. FIG. 14 shows the result of MEMS mask lithography and etching passivation, antireflection coating, and interlayer dielectric layers down to α-Si encapsulation layer 445 and CMOS metal-1 layer 424. Open regions in patterned photoresist layer 403 define the MEMS area of a final monolithic IC/MEMS integrated device.

Figure 15:
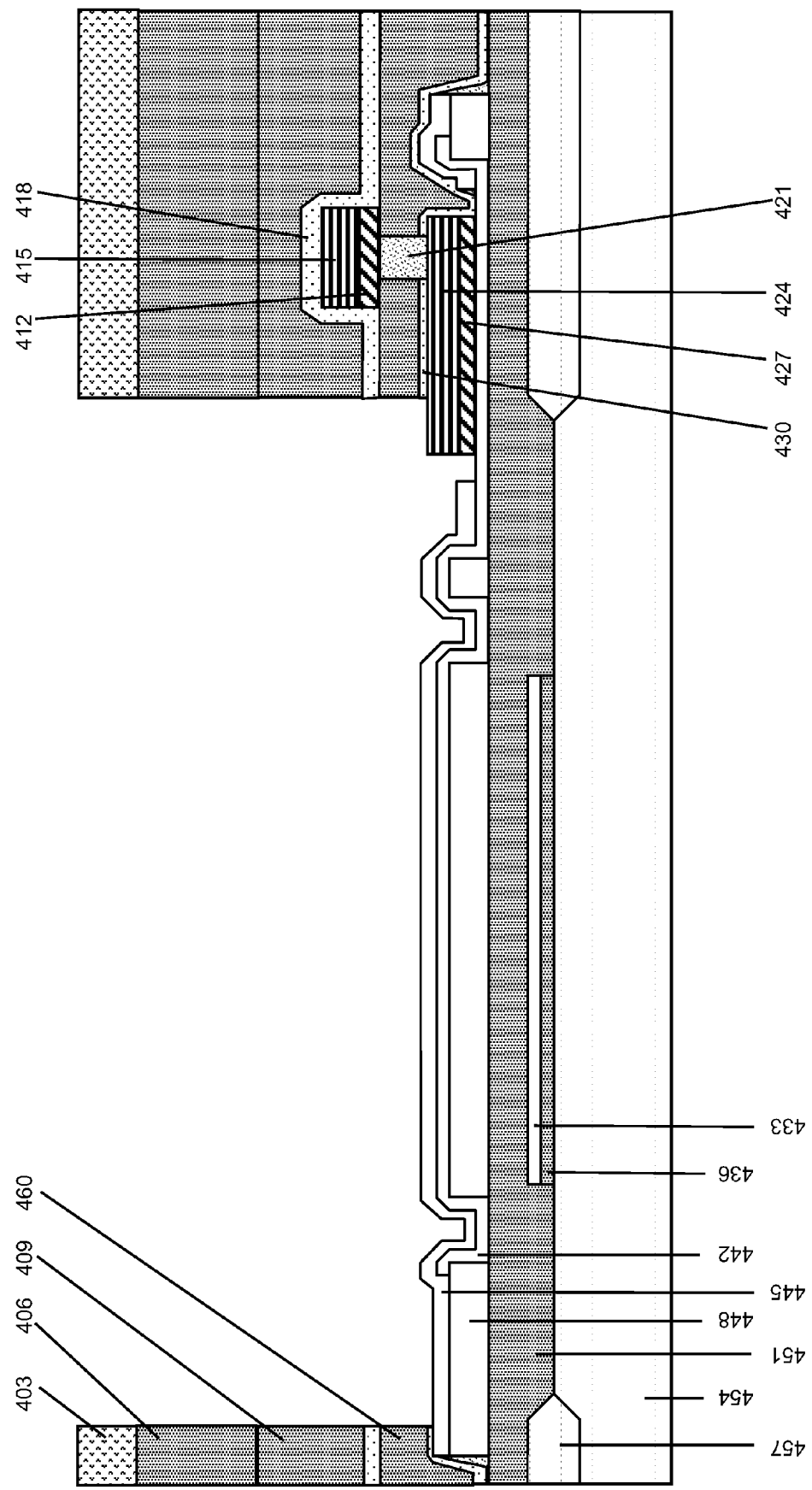
FIG. 15 shows material layers in a partially completed monolithic IC/MEMS microfabricated device.

FIG. 15 shows the result of removing any unwanted CMOS metal-1 such as tungsten 439 in FIG. 14. This may be accomplished with a hydrogen peroxide wet etch, for example.

Figure 16:
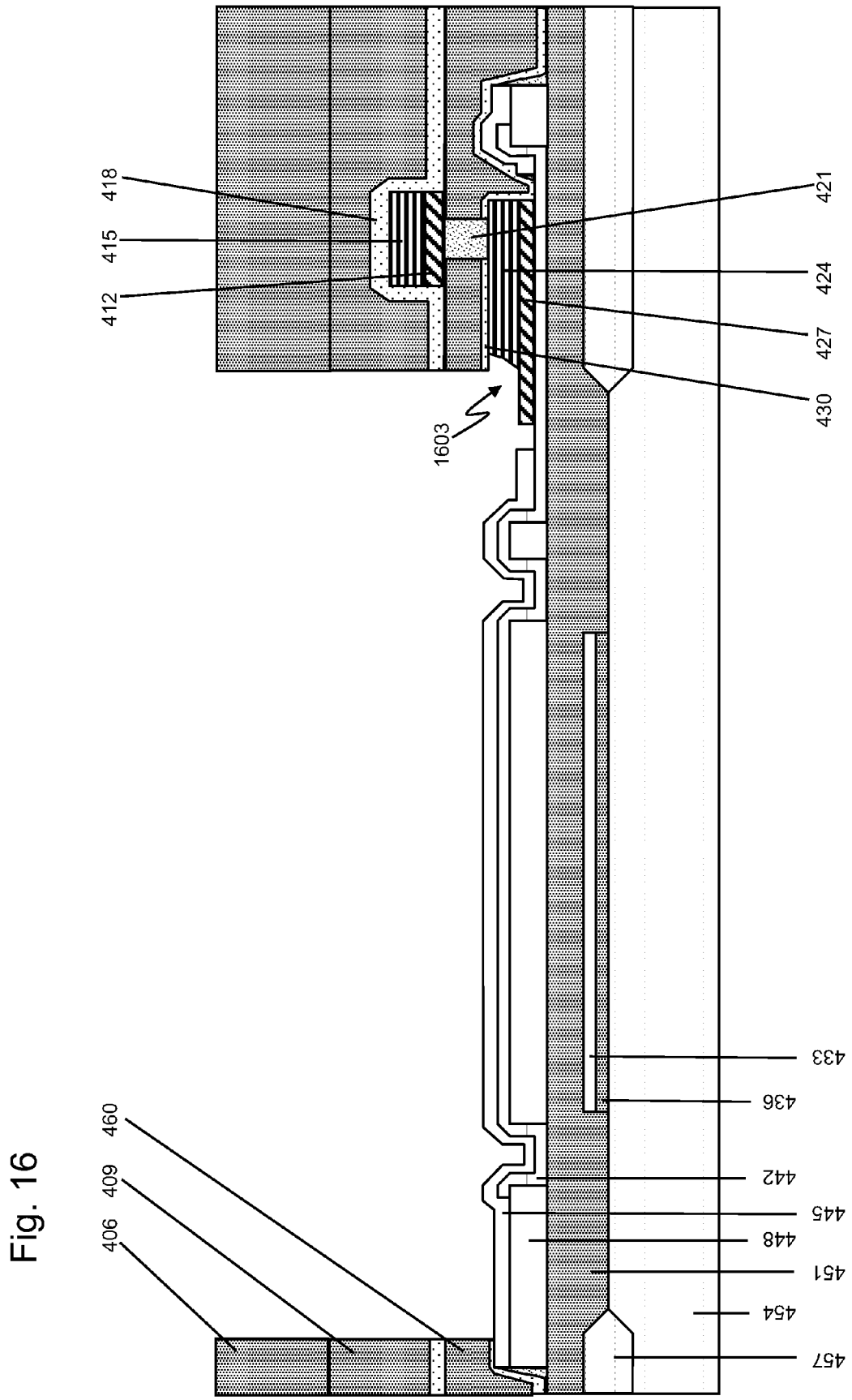
FIG. 16 shows material layers in a partially completed monolithic IC/MEMS microfabricated device.

FIG. 16 shows the result of wet etching CMOS metal-1 to expose, but not remove, Ti/TiN layer 427 in the area called out by arrow 1603.

Figure 17:
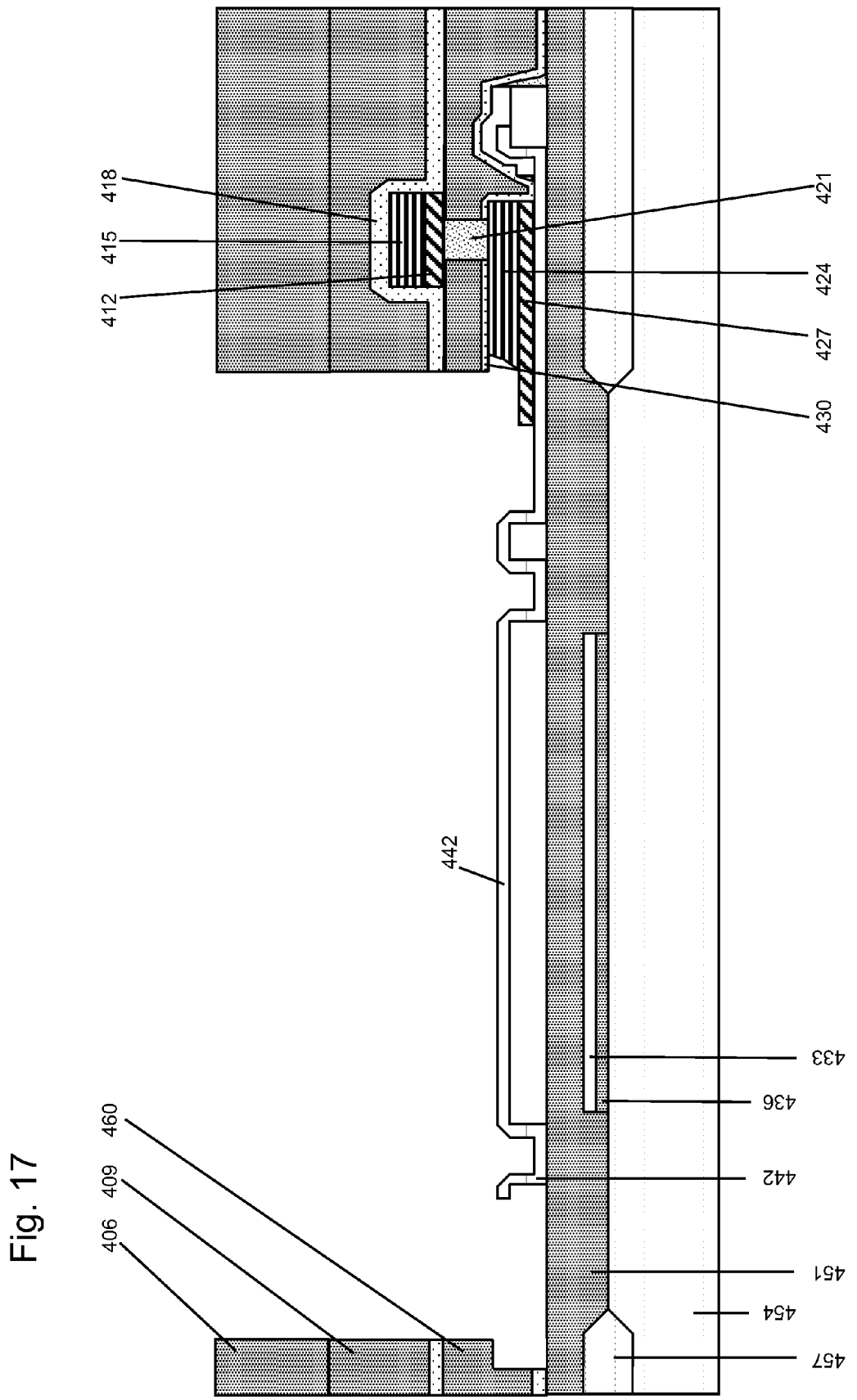
FIG. 17 shows material layers in a partially completed monolithic IC/MEMS microfabricated device.

FIG. 17 shows the result of etching away α-Si encapsulation layer 445 and α-Si sacrificial layer 448 from the structure of FIG. 16. This step may be accomplished by a $XeF_2$ dry etch, for example. Nitride layer 442 may now form ribbon structures that are anchored at their ends but free to flex in between. Ribbons such as these are discussed below in connection with FIGS. 19 and 20, and are also described in U.S. Pat. No. 7,054,051 and in U.S. patent application Ser. No. 11/161,452 filed on Aug. 3, 2005 and Ser. No. 11/336,277 filed on Jan. 20, 2006.

Figure 18:
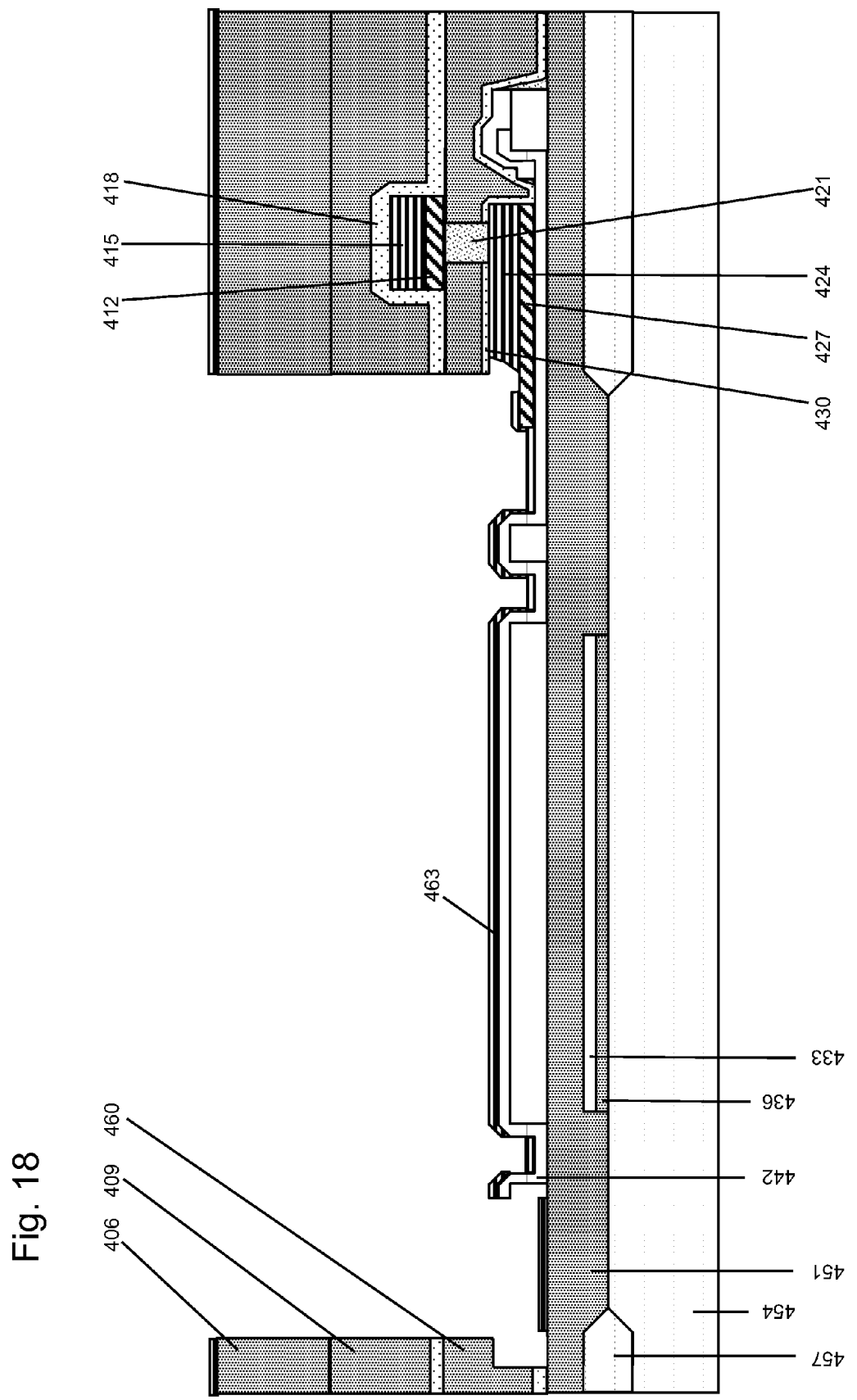
FIG. 18 shows material layers in a partially completed monolithic IC/MEMS microfabricated device.

FIG. 18 shows the result of evaporating aluminum onto the structure of FIG. 17 through a shadow mask. Aluminum layer 463 coats nitride layer 442 and makes an electrical connection to Ti/TiN layer 427 and therefore to CMOS metal-1 and to CMOS circuits in the rest of the chip. The high quality optical mirror surface of evaporated aluminum is preserved in part because it is deposited after MEMS-release etch steps in the overall process. The shadow mask technique eliminates the need to pattern the aluminum layer with lithographic and etch steps.

FIGS. 4-18 show cross sections of part of a CMOS/MEMS device as it is created in a microfabrication process. FIG. 19 shows a top view of part of such a device. (Here, "top view" means the view from a vantage point in the plane of FIG. 18, perpendicular to substrate 454, and viewed from the processed side of a wafer.) In FIG. 19, silicon nitride layer 1905 extends over ribbon region 1920 and interconnection region 1925. In the interconnection region Ti/TiN adhesion layer 1910 supports CMOS metal-1 interconnect layer 1915. In an exemplary device, interconnection region 1925 is approximately 500 μm long while ribbon region 1920 is approximately 200-300 μm long. When aluminum is evaporated onto the structure of FIG. 17 (the results of which are shown in FIG. 18) a shadow mask is used to restrict the metallized part of the wafer to the MEMS area. As shown in FIG. 19, this area is wide enough that aluminum (or another metal) is applied to both ribbon region 1920 and part of interconnect region 1925. The approximate width of the MEMS Metal Area is about 1 mm and the area is long enough to encompass all ribbons in a ribbon array device.

FIG. 20 shows a cross section of the CMOS/MEMS interconnect region of FIG. 19. In FIG. 20, dielectric layer 2010 covers silicon substrate 2030. Interconnect metal 2020 (comprising, for example, a Ti/TiN layer such as 1910 and a CMOS metal-1 such as 1915) is deposited on silicon nitride gull-wing structure 2025. Aluminum 2005/2015 is evaporated onto the structure in one step; however, the gull-wing shape of 2025 prevents aluminum 2005 from coming into electrical contact with aluminum 2015. The non-vertical profile of structures 2020 and 2025 also allows good step coverage for evaporated aluminum 2015 to connect to interconnect metal 2020. The gull-wing structure and the shadow mask technique for aluminum evaporation eliminate the need to pattern the aluminum layer with lithographic and etch steps. This helps maintain a pristine, optically smooth aluminum surface on optical MEMS devices.

FIGS. 1 and 4-20 illustrate a monolithic IC/MEMS process where high-stress silicon nitride is a structural material and amorphous silicon (α-Si) is used as a sacrificial layer. FIGS. 2 and 21 (A-D) illustrate an alternative embodiment of a monolithic IC/MEMS process where high-stress silicon nitride is a structural material and amorphous silicon (α-Si) is used as a sacrificial layer.

In the monolithic IC/MEMS process shown in FIG. 21, ribbons (or other MEMS structures) are buried in polysilicon and encapsulated in silicon nitride. After completion of the MEMS Front End (see FIG. 2) a wafer has an all-silicon surface for compatibility with IC processing. Finally, passivation layers over MEMS structures are etched away after the IC process. At this point removal of the MEMS sacrificial layer and final metallization is performed.

FIG. 21 shows steps in a process related to the MEMS Front-End 210 of FIG. 2. In FIG. 21A a silicon substrate (not shown) supports an oxide layer 2115 and a polysilicon layer 2110. Polysilicon layer 2110 has been patterned and a nitride layer 2105 has been deposited on it and patterned. In FIG. 21B the structure illustrated in 21A has been further covered by, or buried in, polysilicon layer 2120. Polysilicon layer 2120, which includes polysilicon originally deposited in layer 2110, is then patterned and encapsulated in a second nitride layer 2125 as shown in FIG. 21C. Finally, the encapsulating nitride layer is itself encapsulated in a polysilicon layer 2130. Polysilicon layer 2130 and oxide layer 2115 are then etched, leaving a silicon surface everywhere on the wafer. At this point the wafer is ready for IC processing.

FIGS. 3 and 22-24 illustrate another alternative embodiment of a monolithic IC/MEMS process where high-stress silicon nitride is a structural material and amorphous silicon (α-Si) is used as a sacrificial layer. This embodiment includes a set of MEMS LOCOS process steps in the MEMS Front-End block 310 of FIG. 3. Wafers processed according to the steps outlined in FIGS. 22-24 are better planarized than those processed according to the steps outlined in FIGS. 21 A-D. High resolution lithography steps in IC processes require well planarized wafers.

In FIG. 22A layer 2205 is a nitride mask layer applied to a wafer that has been pad oxidized (e.g. with growth of thermal oxide). In FIG. 22B field oxide 2210 has been grown on the structure of FIG. 22A. The field oxide grows only in regions that are not protected by nitride mask 2205. Next, as shown in FIG. 22C, nitride mask 2205 and field oxide 2210 are both etched away, thermal oxide 2220 is grown, and α-Si sacrificial layer 2215 is deposited and patterned, leaving openings such as 2225.

Structural nitride layer 2305 is deposited and patterned on the structure of FIG. 22C as shown in FIG. 23A and the resulting structure is encapsulated in α-Si encapsulation layer 2310 as shown in FIG. 23B.

In the next step, illustrated in FIG. 24A, α-Si encapsulation layer 2310 is patterned and itself encapsulated in silicon nitride layer 2405. Nitride 2405 serves as a CMOS LOCOS barrier. This nitride is then further encapsulated in α-Si (or polysilicon) 2410 as shown in FIG. 24B. Finally, as shown in FIG. 24C, thermal oxide 2220 is removed leaving a wafer with its original silicon surface in all areas that will be used for IC processing in subsequent process steps. The MEMS structures created in the process outlined in FIGS. 3 and 22-24 are located in LOCOS depressions shown in FIGS. 22 A-C. This leaves a wafer that is somewhat planarized and therefore compatible with high resolution lithography steps in later IC processing.

Three variations of a monolithic IC/MEMS process have been disclosed. The process uses silicon nitride as a MEMS structural layer and α-Si as a sacrificial layer. The process takes a side-by-side approach to IC/MEMS integration: electronic circuits and micro-electromechanical devices are built in different areas of a wafer. Further, although the process has been described in terms of MEMS integration with an exemplary CMOS process, MEMS area processing can be equally well integrated with other electronic circuit processes.

As one skilled in the art will readily appreciate from the disclosure of the embodiments herein, processes, machines, manufacture, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, means, methods, or steps.

The above description of illustrated embodiments of the systems and methods is not intended to be exhaustive or to limit the systems and methods to the precise form disclosed. While specific embodiments of, and examples for, the systems and methods are described herein for illustrative purposes, various equivalent modifications are possible within the scope of the systems and methods, as those skilled in the relevant art will recognize. The teachings of the systems and methods provided herein can be applied to other systems and methods, not only for the systems and methods described above.

In general, in the following claims, the terms used should not be construed to limit the systems and methods to the specific embodiments disclosed in the specification and the claims, but should be construed to include all systems that operate under the claims. Accordingly, the systems and methods are not limited by the disclosure, but instead the scope of the systems and methods are to be determined entirely by the claims.

What is claimed is:
1. A microfabrication process comprising the following steps, in sequence:
   (a) processing a silicon wafer according to a MEMS front-end process section;
   (b) processing the wafer according to a complete IC process section; and,
   (c) processing the wafer according to a MEMS back-end process section; wherein,
   the MEMS front-end process section includes: isolation oxidation; depositing an amorphous silicon MEMS sacrificial layer; and, depositing a stoichiometric silicon nitride MEMS structural layer; and,
   wherein,
   the MEMS back-end process section includes: removing the amorphous silicon MEMS sacrificial layer to leave ribbon structures made entirely of stoichiometric silicon nitride, the ribbon structures being anchored at their ends but free to flex in between.

2. The microfabrication process of claim 1 wherein the IC process section comprises CMOS processing steps.

3. The microfabrication process of claim 2 wherein electronic and micro-electromechanical devices are fabricated in separate areas of the wafer.

4. The microfabrication process of claim 1 wherein the MEMS front-end process section includes MEMS LOCOS processing.

5. A microfabricated device made by the process of claim 1, the device having electronic circuits and micro-electromechanical devices integrated on a single wafer.

6. The microfabricated device of claim 5, wherein the MEMS mechanical devices comprise high-stress silicon nitride.

* * * * *